United States Patent [19]

Berg et al.

[11] Patent Number: 5,756,366
[45] Date of Patent: May 26, 1998

[54] MAGNETIC HARDENING OF BIT EDGES OF MAGNETORESISTIVE RAM

[75] Inventors: Lonny L. Berg, Elk River; Allan T. Hurst, Jr., Anoka; Tangshiun Yeh, St. Paul; Paul W. Cravens, Elk River, all of Minn.

[73] Assignee: Honeywell Inc., Minneapolis, Minn.

[21] Appl. No.: 576,732

[22] Filed: Dec. 21, 1995

[51] Int. Cl.$^6$ .................................................. H01L 21/8246
[52] U.S. Cl. ........................... 437/48; 437/918; 437/983
[58] Field of Search ............................ 437/48, 52, 245, 437/246, 918, 983; 365/158, 173

[56] References Cited

U.S. PATENT DOCUMENTS

| | | | |
|---|---|---|---|
| 4,065,742 | 12/1977 | Kendall et al. | 437/918 |
| 4,666,554 | 5/1987 | De Wilde et al. | 437/245 |
| 4,731,757 | 3/1988 | Daughton et al. | 365/173 |
| 4,780,848 | 10/1988 | Daughton et al. | 365/173 |
| 5,060,193 | 10/1991 | Daughton et al. | 365/173 |
| 5,424,236 | 6/1995 | Daughton et al. | 437/52 |
| 5,496,759 | 3/1996 | Yue et al. | 437/48 |

*Primary Examiner*—Chandra Chaudhari
*Attorney, Agent, or Firm*—Gregory A. Bruns

[57] ABSTRACT

Magnetoresistive random access memory bit edges are magnetically hardened to prevent bit edge reversal.

8 Claims, 5 Drawing Sheets

5,756,366

1

MAGNETIC HARDENING OF BIT EDGES OF MAGNETORESISTIVE RAM

RELATED APPLICATION

The present application is related to allowed U.S. patent application Ser. No. 08/576,279, entitled "Integrated Spacer for Magnetoresistive RAM", by Tang-Shiun Yeh, et al. filed on even date herewith and assigned to Honeywell Inc., the assignee of the present application.

BACKGROUND OF THE INVENTION

The present invention relates to ferromagnetic thin film memories and more particularly to a process for the fabrication of a thin film magnetoresistive memory device.

The process for manufacturing the magnetoresistive bit lines involves depositing one or more layers of magnetic material over an underlying layer or surface, and etching the deposited material to a desired configuration.

This process is described in U.S. Pat. No. 5,496,759 which is assigned to Honeywell Inc.

U.S. Pat. No. 4,731,757 dated Mar. 15, 1988, U.S. Pat. No. 4,780,848 dated Oct. 25, 1988, and U.S. Pat. No. 5,060,193 dated Oct. 22, 1991 which are assigned to Honeywell Inc. include background material on magnetoresistive memories and are hereby incorporated by reference.

U.S. Pat. No. 5,496,759, assigned to Honeywell Inc., includes details on the forming of magnetic memory bits and is hereby incorporated by reference. The present invention is an improvement to the process of U.S. Pat. No. 5,496,759.

The process of U.S. Pat. No. 5,496,759 provides first and second layers of thin film ferromagnetic materials separated by a layer of non ferromagnetic material and formed into an elongated shape having tapered ends to provide a magnetic bit. In use, information is kept as a binary bit having one of two alternative logic levels stored in the two layers or films by having the magnetization point in one direction or the other(but opposite in each of these layers to the direction in the other), generally along the easy axis of magnetization. If the direction of magnetization is caused to rotate from such a direction by external magnetic fields, the electrical resistance of the layers will change with this magnetization direction rotation because of the magnetoresistive properties of the films. Measurement of the resistance allows the state of the memory to be determined.

The process described in U.S. Pat. No. 5,496,759 generally provides reliable magnetic bits. However it has been observed that when this process is used for manufacturing magnetic memory bits, that some number of bits will fail after a number of repeated memory storage and retrieval operations, or read/write cycles. The failure mechanism is believed to be bit edge reversal which is sometimes called edge spin reversal. The elongated shape of the bit structure causes large demagnetization fields along the edge of the layers. In such large demagnetization fields, electron spins at the edge of the films are constrained to lie nearly parallel to these edges and the direction of elongation of these films. During read or write operations it is intended that bit edge reversal does not occur. Thus, a need exists for a magnetoresistive memory bit which allows an unlimited number of read/write cycles without bit edge reversal.

SUMMARY OF THE INVENTION

The present invention solves these and other needs by providing a process for forming a magnetoresistive memory device and includes forming a stack of materials including

2 a layer of magnetic material; forming an amorphous dielectric on the stack; selectively removing portions of the amorphous dielectric to define a magnetic bit pattern; removing portions of the stack according to the pattern to define a magnetic bit having a bit edge; and performing a magnetic hardening process at said bit edges.

DETAILED DESCRIPTION

Figure 1:
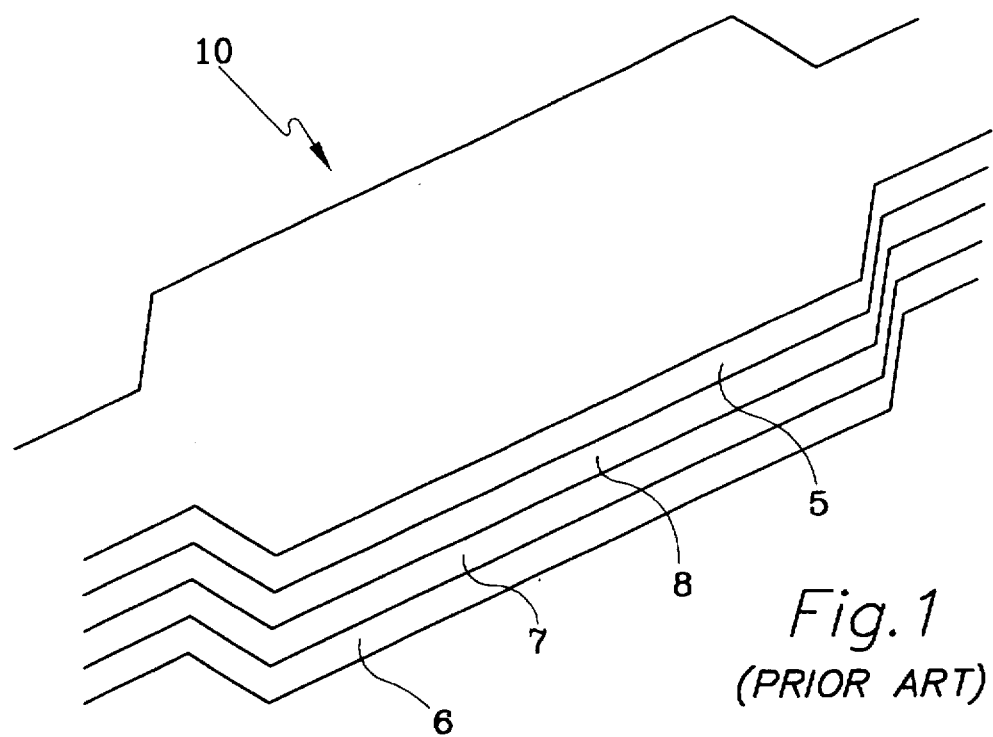
FIG. 1 is an isometric drawing of a portion of a magnetoresistive memory bit according to the prior art.

A portion of a magnetoresistive memory bit 10 showing selected layers is shown in FIG. 1, including first magnetic layer 6, second magnetic layer 8, and intermediate layer 7. Other layers are represented by 5.

Figure 2:
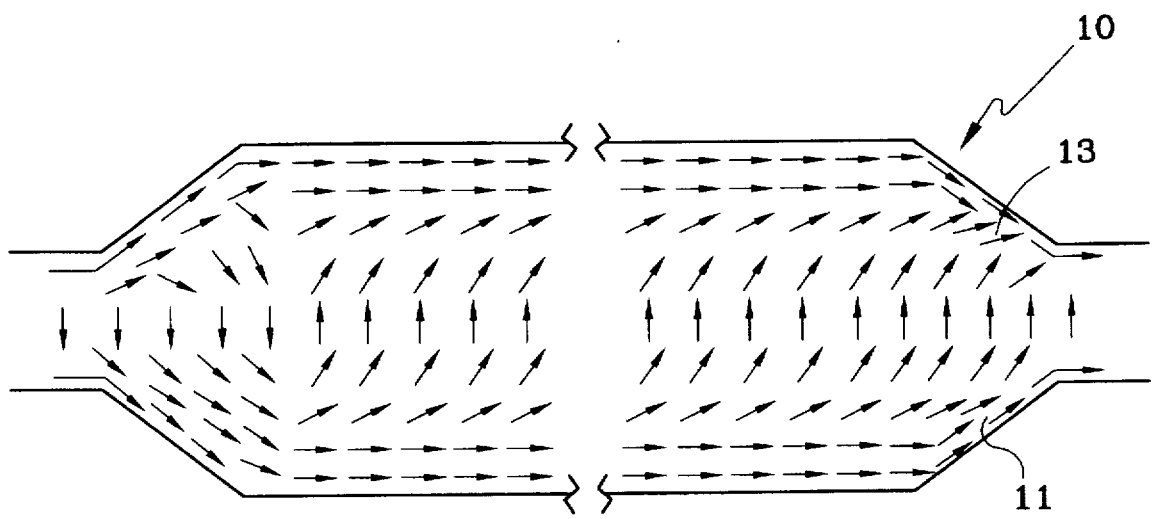
FIG. 2 is a partial planar view of a portion of FIG. 1.

A representation of the magnetizations of a section of one of films 20' and 24' is shown in FIG. 2. FIG. 2 shows the magnetizations for the storage of a logic value bit of information with the magnetizations at central locations shown pointed upward in that figure and edge magnetizations therein shown pointed primarily to the right. In a similar representation (not shown) of the magnetizations for the storage of an alternative logic value bit of information, the magnetizations at central locations would be shown pointed downward, and edge magnetizations would be shown still pointed primarily to the right. Note that the magnetization value gradually increases in the central portion of the film, that is away from the edge portions where the magnetization would remain in the same directions for both memory states. As previously described herein, there is evidence that some number of magnetoresistive bits fail after a number of read/write cycles. A read or write cycle includes the generation of a magnetic field by the bit itself and by a conductive metal strap (not shown) located on top of the bits. In some cases the magnetic field apparently causes the magnetization along a portion of the bit edge to be flipped into another direction. When this occurs, the bit fails and will no longer function. Note that in FIG. 2 in area 11, the magnetization is uniformly upwardly and to the right, whereas in area 13 the magnetization is not uniform, and magnetization at the edge is downward and to the right, while magnetization away from the edge is upward and to the right. There is evidence that a bit structure as shown in FIG. 2 is vulnerable to bit edge reversal in area 13. Once the bit edge reversal occurs at area 13, then after additional read/write cycles the bit edge reversal seems to propagate to the left and the bit fails.

The present invention is an improvement to the process of U.S. Pat. No. 5,496,759 and the process steps of the present invention will be described herein. Reference may be made to U.S. Pat. No. 5,496,759 for a more detailed description of other process steps.

Figure 3:
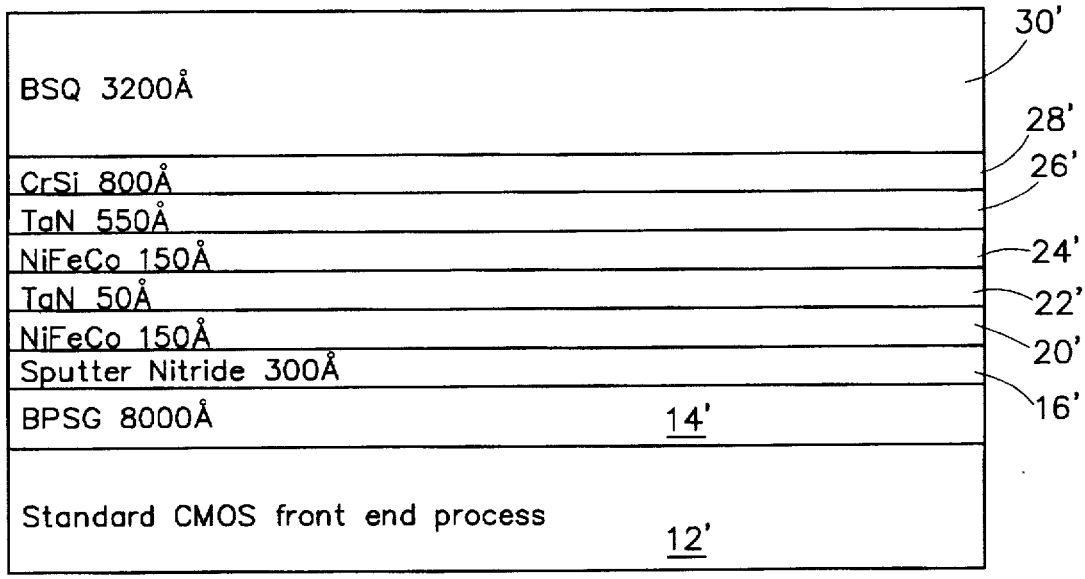
FIGS. 3-7 are cross-sectional views showing certain of the steps of forming a magnetoresistive memory bit in accordance with the principles of the present invention.

FIG. 3 is representative of a cross section of layers of material that are to be used in forming a magnetoresistive device on silicon wafer 12' having underlying integrated circuits, e.g., CMOS. FIG. 3 shows BPSG layer 14', a sputter nitride layer 16', NiFeCo layer 20', TaN layer 22', NiFeCo layer 24; TaN layer 26', CrSi layer 28' and BSQ layer 30' all as generally described in U.S. Pat. No. 5,496,759. While U.S. Pat. No. 5,496,759 showed longitudinal cross sections of the formation of a memory device, FIGS. 3–7 of the present invention are not cross sections.

Figure 4:
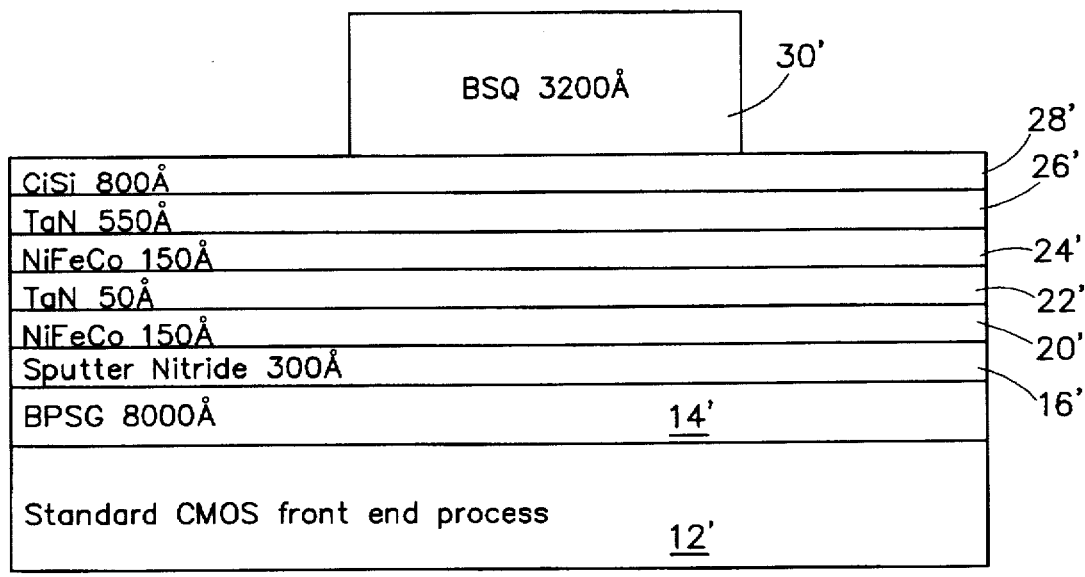
Figure 5:
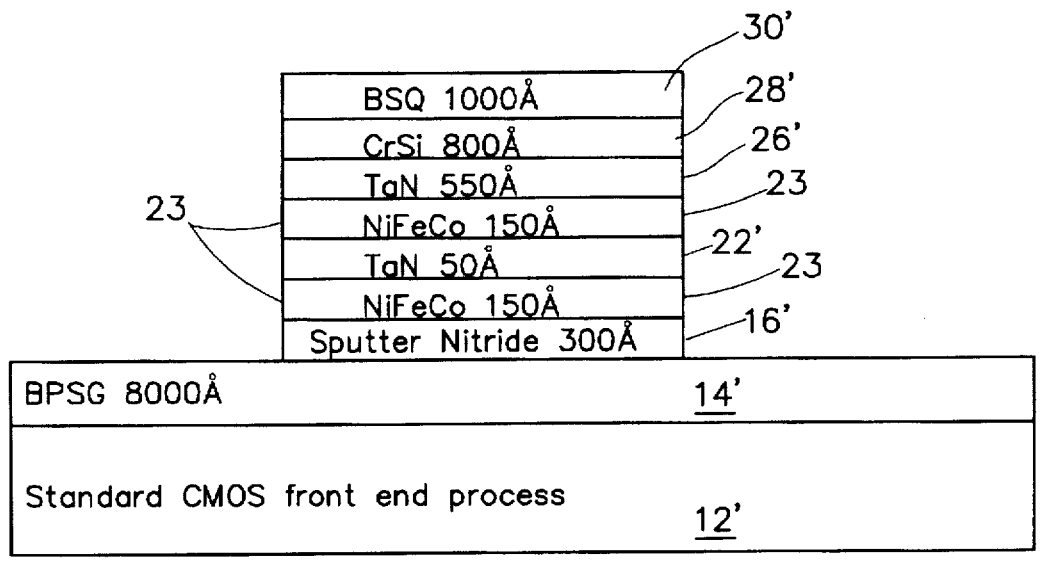
Figure 6:
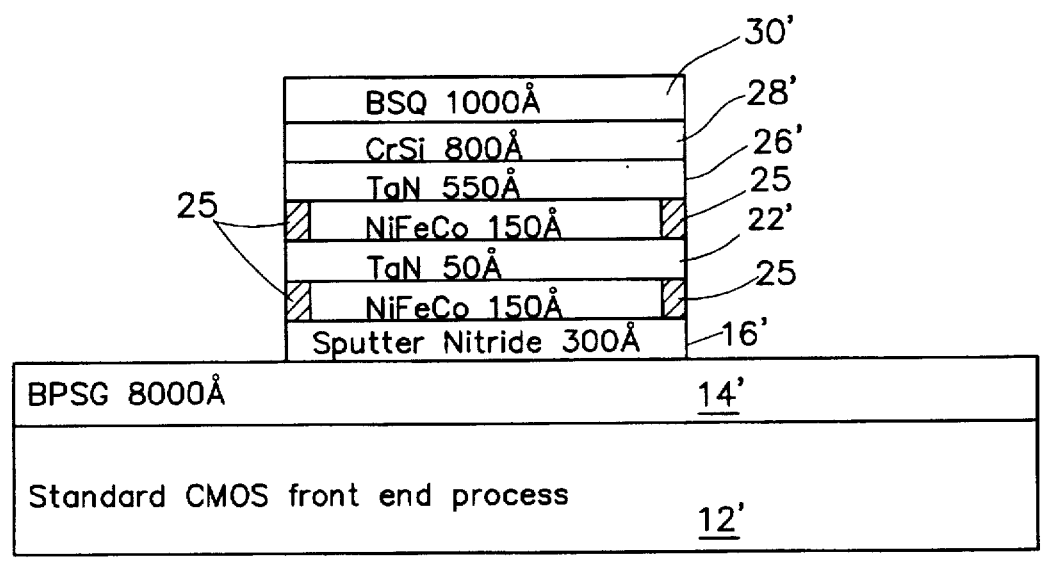
Figure 7:
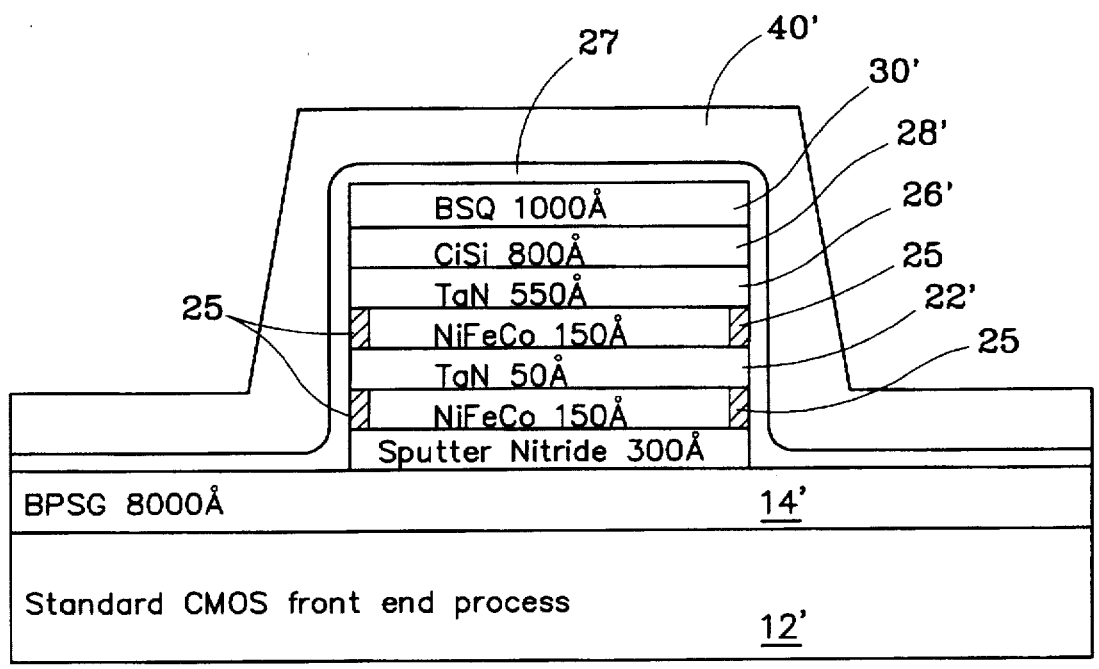

Referring to FIG. 3 wherein a first layer of an amorphous dielectric, e.g., bias sputtered quartz (BSQ) 30' is deposited to a thickness of approximately 3200 angstroms. BSQ layer 30' is then patterned and etched to serve as a masking layer as shown in FIG. 4. The masking layer defines the MRAM bit pattern for ion milling. The wafers are then ion milled, for example, in a Commonwealth ion mill. The ion milling removes the exposed portions of magnetic stack 18 as shown in FIG. 5 to form a bit pattern and may extend slightly into BPSG layer 14'. In addition, the ion milling removes a portion of BSQ layer 30', resulting in BSQ layer 30' now having a thickness of about 1000 angstroms.

At this time in the process, bit edges 23 of magnetic material layers 20' and 24' are exposed. It is important to be certain that the exposed bit edges 23 are clean and this can be accomplished by a variety of processes. In one successful prototype, an EKC process was used. Other processes such as ion milling or a wet chemical etch could also be used. Once the bit edges 23 are cleaned, they may be readily oxidized by placing the wafer in an oxygen plasma for a length of time. An oxide will form on the exposed edges 23 of NiFeCo layers 20' and 24'. As a consequence, typically several hundred to a thousand angstroms of magnetic material will be oxidized as shown by the cross-hatched portions 25 of FIG. 6. The cross-hatched edge portions represent nickel-iron-cobalt oxide which is magnetically harder than the inner portions of magnetic material layers 20' and 24'. This higher coercivity level of oxidized portions 25 acts to prevent bit edge reversal.

After formation of oxide layer 25 it may be important to protect it so that oxide layer 25 will not be affected by any subsequent process steps. Oxide layer 25 can be protected by encapsulation using a layer 27 of silicon nitride having a thickness of about 500 angstroms.

Following the just described oxidation step and the oxide protection step, the process of U.S. Pat. No. 5,496,759 resumes with the deposition of a layer 40' of BSQ in preparation for bit oxide photo cut and etch.

The subsequent process will, of course, require consideration of etching times for silicon nitride layer 27, if used, which was not present in U.S. Pat. No. 5,496,759.

Test results of the magnetic hardening process of the present invention were obtained by measuring the resistance versus magnetic field, $H_K$, of a 200 micron long by 10-micron wide strip, with the edges of the strip without oxidation and with oxidation.

The test shows the effective magnetic field $H_K$ on the horizontal axis and the resistance on the vertical axis. In addition, the test shows the value of the edge reversal field. One curve is for changing a magnetic field from positive to negative and the other curve is for changing a magnetic field from negative to positive. The place on the shoulders of the curves where the opening between the wires disappears is an indication of when edge spin reversal occurs. This parameter is an indication of how well this magnetic material will perform.

Figure 8A:
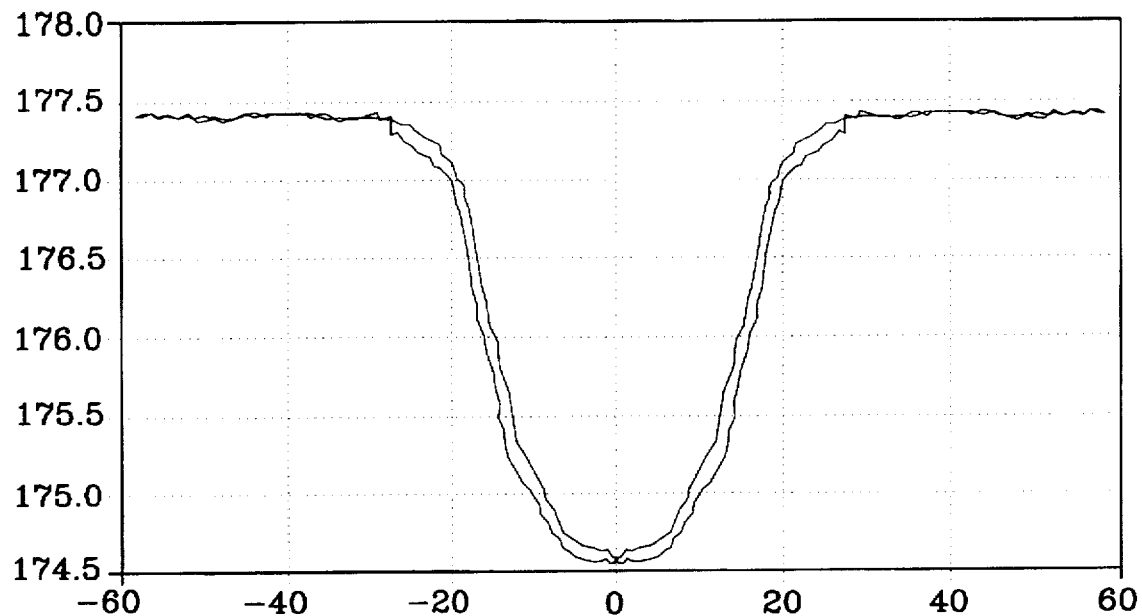
FIGS. 8a and 8b are graphs showing certain test results.
Figure 8B:
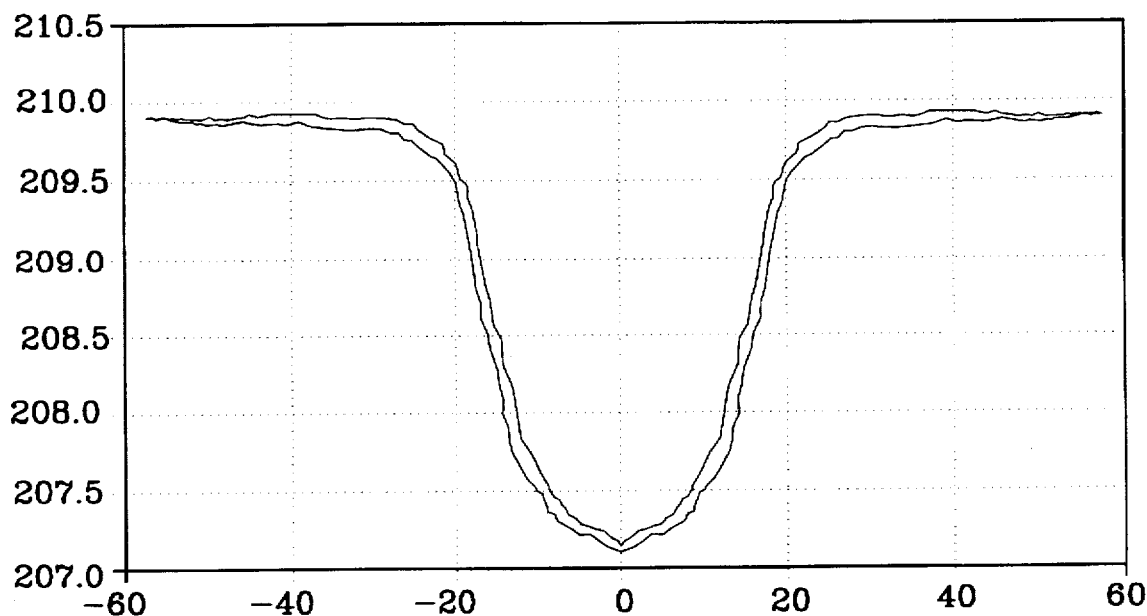

FIG. 8a shows that without the oxidation process of the present invention, the edge reversal occurs at a field $H_K$ of about 25 gauss. FIG. 8b shows that after the oxidation process, the edge reversal occurs at a field $H_K$ of greater than 40 gauss. Thus, the present invention provides a significantly higher coercivity at the bit edges which is helpful in preventing edge spin reversal.

The magnetic hardening process of the present invention may be easily integrated into the process for manufacturing magnetoresistive memory devices.

The scope of the present invention is to be limited by the appended claims and not by the foregoing description.

We claim:

1. A process for forming a magnetoresistive memory device on an insulative layer, comprising the steps of:

forming a stack of a plurality of materials on said insulative layer, said stack including at least a first layer of a magnetic material;

forming a first layer of an amorphous dielectric on said stack;

selectively removing portions of said amorphous dielectric to define a pattern for a magnetic bit;

removing portions of said stack according to said pattern to define a magnetic bit in said first layer of magnetic material, said magnetic material having a first level of coercivity;

said magnetic bit having a bit edge with said magnetic material exposed along said bit edge;

performing a magnetic hardening process to increase said first level of coercivity to a second level of coercivity along said bit edge; and performing subsequent processing steps.

2. Process of claim 1 wherein said magnetic hardening step comprises the steps of:

forming an oxide layer on said magnetic material along said bit edge; and forming a protective layer on said oxide layer.

3. Process of claim 2 wherein said oxide layer has a thickness in a range of about 100 to 1000 angstroms.

4. Process of claim 3 wherein said protective layer is silicon nitride.

5. A process for forming a magnetoresistive memory device on an insulative layer, comprising the steps of:

forming a stack of a plurality of materials on said insulative layer, said stack including at least first and second layers of a magnetic material, said first and second layers separated by an intermediate layer;

forming a first layer of an amorphous dielectric on said stack;

selectively removing portions of said amorphous dielectric to define a pattern for a magnetic bit;

removing portions of said stack according to said pattern to define a magnetic bit in said first and second layers of magnetic material, said magnetic material having a first level of coercivity;

said magnetic bit having a bit edge with said magnetic material of said first and second layers being exposed along said bit edge;

performing a magnetic hardening process to increase said first level of coercivity to a second level of coercivity along said bit edge; and performing subsequent processing steps.

6. Process of claim 1 wherein said magnetic hardening step comprises the steps of:

forming an oxide layer on said first and second layers of magnetic material along said bit edge; and forming a protective layer on said oxide layer.

7. Process of claim 2 wherein said oxide layer has a thickness in a range of about 100 to 1000 angstroms.

8. Process of claim 3 wherein said protective layer is silicon nitride.

* * * * *